United States Patent
Poirier et al.

(10) Patent No.: US 6,745,363 B2
(45) Date of Patent: Jun. 1, 2004

(54) EARLY ERROR DETECTION USING ECC

(75) Inventors: Christopher A. Poirier, Fort Collins, CO (US); Ronny L. Arnold, Fort Collins, CO (US)

(73) Assignee: Hewlett-Packard Development Company, LP, Houston, TX (US)

( * ) Notice: Subject to any disclaimer, the term of this patent is extended or adjusted under 35 U.S.C. 154(b) by 62 days.

(21) Appl. No.: 10/079,451

(22) Filed: Feb. 19, 2002

(65) Prior Publication Data

US 2002/0120901 A1 Aug. 29, 2002

Related U.S. Application Data

(63) Continuation-in-part of application No. 09/365,132, filed on Jul. 30, 1999, now abandoned.

(51) Int. Cl.$^7$ ................................. G06F 11/10
(52) U.S. Cl. ........................ 714/763; 714/773
(58) Field of Search ................. 714/763, 773, 714/772

(56) References Cited

U.S. PATENT DOCUMENTS

| | | | | | |
|---|---|---|---|---|---|
| 3,893,071 | A | * | 7/1975 | Bossen et al. | 714/765 |
| 3,949,208 | A | * | 4/1976 | Carter | 714/765 |
| 4,450,561 | A | * | 5/1984 | Gotze et al. | 714/757 |
| 4,617,664 | A | * | 10/1986 | Aichelmann et al. | 714/758 |
| 4,701,915 | A | * | 10/1987 | Kitamura et al. | 714/6 |
| 5,539,754 | A | * | 7/1996 | Zuras et al. | 714/785 |
| 5,600,659 | A | | 2/1997 | Chen | 371/37.1 |
| 5,805,615 | A | | 9/1998 | Chen | 371/37.6 |
| 5,878,059 | A | * | 3/1999 | Maclellan | 714/768 |

\* cited by examiner

*Primary Examiner*—Stephen M. Baker

(57) ABSTRACT

A method of rapidly detecting data errors includes generating a reference syndrome from data bits in a data word, the reference syndrome having at least a first portion and a second portion, generating a partial error code from the data bits and the first portion of the reference syndrome, and initiating an error recovery procedure if the partial error code contains any true values.

23 Claims, 4 Drawing Sheets

EARLY ERROR DETECTION USING ECC

RELATED APPLICATION

The present application is a continuation-in-part of U.S. patent application Ser. No. 09/365,132, filed Jul. 30, 1999, entitled "Faster ECC Scheme," now abandoned, which is hereby incorporated by reference for all that is disclosed therein.

FIELD OF THE INVENTION

This invention relates generally to error correction codes (ECC) and more specifically to early detection of correctable data errors using an error correction code.

BACKGROUND

Error correction codes are often used in memory systems, busses or other data transmission environments. The general idea is to accept a data word of some number n of bits, compute from that data a reference syndrome of m-many bits, and then store or transmit an augmented word of those n+m bits. Upon retrieval or reception, the n bits of data are used again to compute a check syndrome of m-many bits, using the same algorithm that was used to produce the reference syndrome. The check syndrome is then compared with the retrieved or received reference syndrome. If they are identical, the original data word has been retrieved or transmitted without error. The power of the Error Correction Code (ECC) technique is that a few bits of syndrome can protect many bits of data. In the simplest case a single bit error (whether in the data or the received reference syndrome) can be detected and automatically corrected. An extension of the simplest case allows detection (but not automatic correction) of two bit errors. In addition, there are various schemes in which multi-bit errors can be detected and automatically corrected.

However, conventional ECC schemes form a complete error correction code before interpreting the results and initiating recovery procedures. This causes delays which, although very small individually, are collectively substantial. The flow of data is at the heart of modern electronic systems. Modern computer systems access millions of bits of data each second, and the access to data is often the most critical bottleneck. Therefore, improved systems of ensuring data integrity and speeding data access are needed.

SUMMARY

Early detection of errors using an error correction code is enabled by forming a partial error code before a complete error code can be generated, and initiating an error recovery procedure as soon as the partial error code indicates the presence of a possible correctable error in the associated data word. The partial error code is formed based on a subset of the bits in reference and check syndromes generated from the data word. The partial error code consists of a subset of the bits of a complete error code. Errors can be detected earliest when the number of data bits used to generate each bit in the reference and check syndrome subsets is minimized.

After the partial error code is formed the generation of the complete error code continues. When the complete error code is available, the location of the error in the data word (or in the reference syndrome) can be determined. If the complete error code indicates that the error is not correctable, the recovery procedure can be aborted or changed as desired.

BRIEF DESCRIPTION OF THE DRAWING

Illustrative and presently preferred embodiments are shown in the accompanying drawings, in which.

DESCRIPTION

Figure 1:
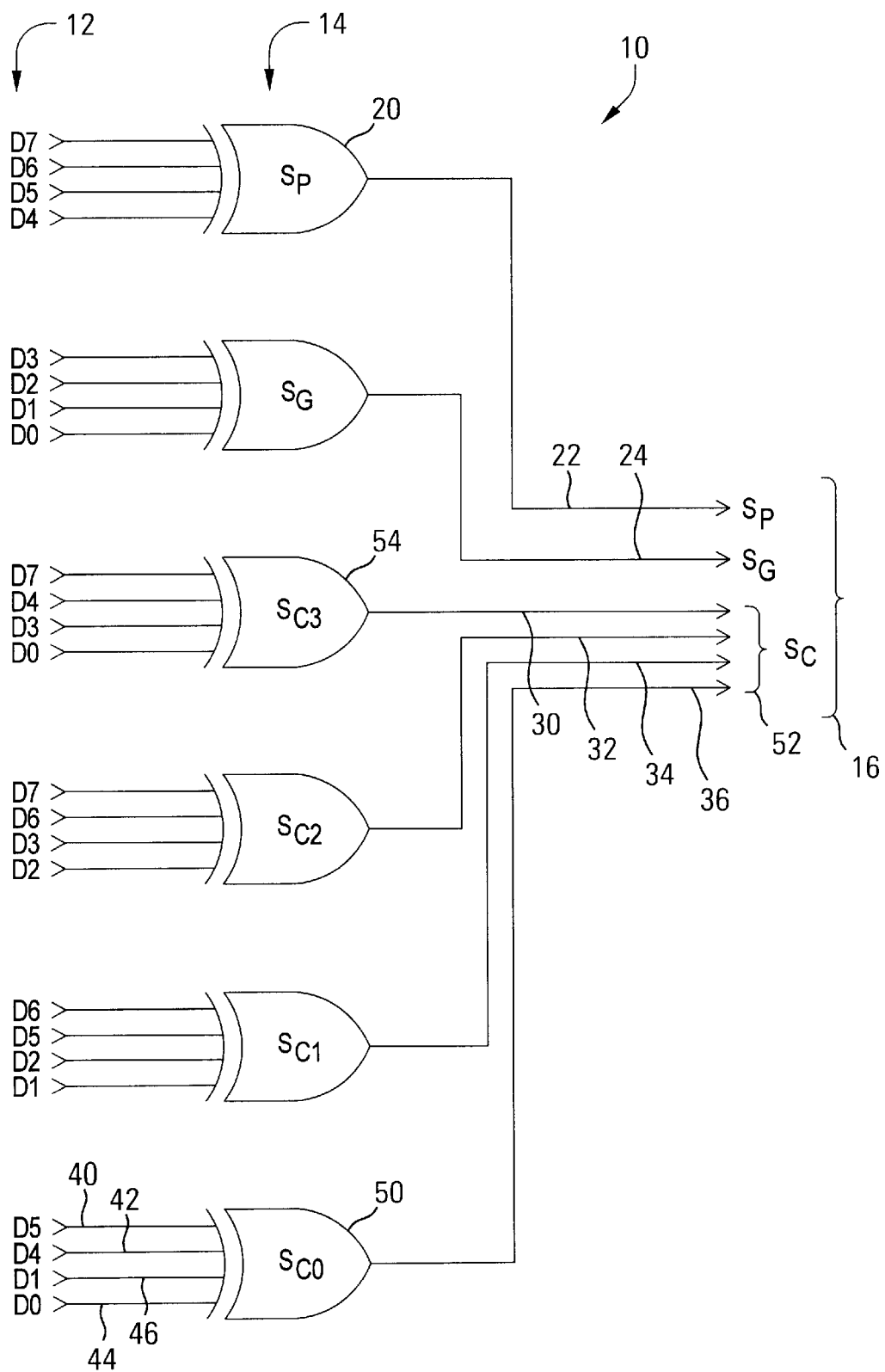
FIG. 1 is a diagram of an exemplary circuit for generating syndromes from which an error correction code can be created.

The drawing and description, in general, disclose a method and apparatus for the early detection of errors using an Error Correction Code (ECC). Errors can be detected early based upon a partial ECC, meaning that the presence of an error can be detected before the entire ECC is fully decoded. This allows an error recovery procedure to be initiated before the nature or location of the error is known.

The error recovery procedure can be any action desired, such as delaying part of a calculation or reordering instructions requiring the data, depending upon the system being used. Note that the error recovery procedure is not limited to error correction, but could be any type of recovery. For example, the signal indicating whether a possible correctable error exists can be used to determine whether processing should proceed early in the absence of a correctable error, either because the data is good or because a non-correctable error exists, and processing can be terminated downstream.

Because the nature and location of the error is not known before fully decoding the entire ECC, the error recovery procedure may be modified or terminated after the entire ECC is fully decoded. This early detection of errors provides for faster response to the most probable type of error, a single bit error in the data word used to generate the ECC. In many cases, a clock cycle can be saved, or the clock period of the system clock shortened, by utilizing an early error detection scheme. This time savings, although small individually, can lead to substantial cumulative time savings when retrieving large amounts of data. The early detection of errors is useful in any circumstance when data is retrieved along with a reference syndrome for generating an ECC, such as when data is retrieved from a storage medium or transmitted over a network, etc.

Early detection of errors using an ECC may be applied to any type of error correction system in which the syndromes may be divided into multiple portions, as will be explained below. For example, the method and apparatus for the early detection of errors will be described herein as it applies to a partial forward error correction system which corrects one and detects two errors in a data word.

This exemplary system, referred to hereinafter as "partial ECC," is particularly useful when retrieving partitioned data words, because the syndromes and error code can be generated in stages based on the partitions in the data word. Furthermore, the electrical circuit for generating the syndromes and error code can be a fraction of the size and complexity of those for full ECC algorithms, since the same electrical circuit can be used in turn to process each data word partition.

As in many ECC variations, the idea behind the partial ECC system is to accept a data word of some number N of bits, compute from that data word a reference syndrome of M-many bits, then store or transmit an augmented word of those N+M bits. Upon retrieval or reception, the N data word bits are used to generate a check syndrome of M-many bits, using the same algorithm used to generate the reference syndrome. Thus, if no errors occurred in the data word between the time the reference and check syndromes were generated, the reference and check syndromes will be identical. One or more protected transactions can be performed with the data between the time the reference and check syndromes are generated, such as storing or transmitting the data. The reference and check syndromes can be combined to generate an error code which identifies the location of single bit errors in the data word, enabling correction of the data word. Many different ECC systems exist for detecting and automatically correcting varying numbers of errors in data words.

Before continuing with the description of the method and apparatus for early error detection, the exemplary partial ECC system upon which early error detection may be based will be described in more detail. However, it is important to note that early error detection using an ECC is not limited to application with this partial ECC system. Generally, ECC systems can detect a greater number of errors than they can correct, so an opportunity exists in most of these ECC systems to initiate early recovery procedures as soon as an error is detected and before the full ECC process is complete for a data word. As mentioned above, early error detection may be applied to any type of error correction system in which the syndromes may be divided into multiple portions, or groups of bits, where one of the portions is capable of indicating the presence of an error in the data word.

To simplify the discussion, the exemplary partial ECC system described herein is adapted to an 8-bit data word with 6 syndrome bits. However, in practical data systems, larger data words are typically used for a number of reasons, such as to match the bus size of the system and to reduce the ratio of syndrome bits to data bits. Furthermore, as will be discussed below, early error detection based upon this partial ECC system is more efficient with larger data words.

In the partial ECC system, the reference and check syndromes are each generated from a data word in stages. Referring now to FIG. 1, a syndrome generator 10 for partial ECC will be described. Each bit of the syndrome 16 is produced as the output of an exclusive-OR (XOR) tree, which may be visualized as an XOR gate (e.g., 20) with numerous inputs. The XOR trees 14 each form a bit of the syndrome 16. (As mentioned above, the same circuit layout is used to generate both reference and check syndromes, one before the protected transaction, the other after.) Each XOR tree (e.g., 20) has a unique selection of bits 12 from the data word as its inputs, with the XOR tree indicating whether the inputs have an odd number of true values, or an odd parity. The bits of the data word are each used as an input to at least two XOR trees (e.g., 20) and are arranged such that each data bit contributes to a unique combination of XOR trees 14 or syndrome bits. Thus, each possible single bit error in a data word will result in a unique error code when the reference and check syndromes are combined, as will be described below.

Note that the XOR trees 14 discussed herein can be implemented in any number of manners, such as a lookup table, finite state machine, or trees or cones of XOR gates reducing numerous inputs to a single output, arranged in any desired combination, as the XOR function is associative. Any of these implementations simply result in a true value when the number of true-valued inputs is odd, otherwise the result is false.

The exemplary syndrome generating circuit of FIG. 1 is illustrated in the following table:

TABLE 1

| Ith Group | Data Bit | $S_P$ | $S_G$ | $S_{C\,(I)}$ (bits 3–0) | | | |
|---|---|---|---|---|---|---|---|
| 0 | 7 | X | 0 | X | X | 0 | 0 |
| 0 | 6 | X | 0 | 0 | X | X | 0 |
| 0 | 5 | X | 0 | 0 | 0 | X | X |
| 0 | 4 | X | 0 | X | 0 | 0 | X |
| 1 | 3 | 0 | X | X | X | 0 | 0 |
| 1 | 2 | 0 | X | 0 | X | X | 0 |
| 1 | 1 | 0 | X | 0 | 0 | X | X |
| 1 | 0 | 0 | X | X | 0 | 0 | X |

The 8-bit data word illustrated in the table above is divided into two partitions or groups, number 0 and 1. The first column indicates the group number of each data bit. Note from the table that data bits 4–7 are in group 0 and data bits 0–3 are in group 1. The syndrome consists of six bits and is divided into three portions, an $S_P$ bit 22 (see FIG. 1), an $S_G$ bit 24 and four $S_C$ bits 30, 32, 34 and 36. The $S_C$ bits contain the syndrome code, the $S_G$ bit is formed using the data bits according to group number as illustrated in TABLE 1 above, ensuring that each data bit contributes to a unique combination of syndrome bits, given the repeating pattern in the $S_C$ portion, and the $S_P$ bit is a parity bit ensuring that each data bit contributes to an odd number of syndrome bits. In one exemplary embodiment, the syndrome is a Hamming partial error correction code.

Each column of X's and 0's under the syndrome bits illustrate the inputs to the XOR trees 14 for each syndrome bit. An X in a column indicates that the corresponding data bit is an input to that column's XOR tree (e.g., 20), a 0 indicates that the corresponding data bit is not an input to that column's XOR tree. For example, to form the least significant bit of the syndrome, the inputs to that column's XOR tree 50 are data bits 5, 4, 1, and 0 (40, 42, 46, and 44, FIG. 1). Note the repeating pattern in the $S_C$ portion 52 of the syndrome, which allows parts of the circuit to be reused for the two partitions or groups in the data word. (The circuit illustrated in FIG. 1 is conceptual and does not include any of these system-dependent optimizations.) The $S_C$ portion of the syndrome may thus be generated in stages, one for the first group and another for the second group, with the two groups being combined by XOR gates to generate the final $S_C$: $S_C = S_{C(0)}$ XOR $S_{C(1)}$. Staged generation of the $S_P$ and $S_G$ portions of the syndrome is also acceptable. This staged generation is possible because of the associative nature of the XOR function, meaning that the order that bits are processed in the XOR tree is not important. However, a single stage of the $S_C$ portion of the syndrome is not useful alone, because only complete reference syndromes are stored with the data. That is, syndrome stages are not stored, and some syndrome bits are likely inverted during the XOR operations combining the stages.

The $S_G$ bit ensures that each data bit contributes to a unique combination of syndrome bits, given the repeating pattern in the $S_C$ portion, and the $S_P$ bit ensures that single-bit errors produce error codes with odd parity.

The choice of which syndrome bits each data bit will contribute to is not important as long as each data bit contributes to at least three syndrome bits, at least one of which is in the $S_C$ portion of the syndrome, and each data bit contributes to a unique combination of syndrome bits overall. In this example, the pattern of X's in the XOR trees 14 of the $S_C$ portion of the syndrome was selected to equalize the number of data bits contributing to each XOR tree (e.g., 20). Notice that each XOR tree (e.g., 20) illustrated in FIG. 1 and the table above has four data bit inputs. Another acceptable arrangement of data bit contributions to the XOR trees 14 following the guidelines above would have required six inputs to the XOR tree 54 for $S_C$ bit 3 and only two inputs to the XOR tree 50 for $S_C$ bit 0. That arrangement may have led to a larger circuit and a greater delay in creating the $S_C$ portion, since the largest number of inputs to an XOR tree would have been six, rather than four. In general, it takes longer to process a higher number of inputs, or results in a larger circuit.

As will be explained in greater detail below, error detection is earliest and most efficient when XOR tree inputs are moved from one portion to another, making it faster to generate one portion of the syndrome than to generate the remaining portions of the syndrome. Specifically, the number of inputs in the XOR trees of the $S_C$ portion of the syndrome would be reduced, and the number of inputs in the XOR trees of the $S_P$ and $S_G$ portions of the syndrome would be increased. Thus, the $S_C$ portion of the syndrome would be generated more quickly and would be used to trigger an error recovery procedure before the entire syndrome and error code was generated. (Note that for the exemplary 8-bit data word described herein, each XOR tree 14 in the syndrome generator 10 has an equal number of data bit inputs. However, as will be described below, this is not always the case for larger data words.)

Once the reference syndrome has been generated for a data word, some protected transaction has been accomplished, and a check syndrome has been generated for the retrieved data word, an error code is formed from the reference and check syndromes to identify and locate the error. The error code is formed by comparing the reference and check syndromes using an XOR function.

In this partial ECC system, the results of the error code are interpreted according to the following table:

TABLE 2

| Error Code Parity | 1's | Error Condition |
| --- | --- | --- |
| Even | 0 | No errors |
| Even | >0 | Two bits of error from anywhere |
| Odd | 1 | Single bit syndrome error |
| Odd | >1 | Single bit data error |

Thus, if the error code contains no 1's, there were no errors. If there were an even number of 1's, there were two bits of error either in the data or in the syndrome, which is not a correctable error in this ECC system, so any error recovery procedure initiated by the early error detection would likely be aborted. If there were a single 1 in the error code, there was a single bit error in a syndrome, which can possibly be ignored. If there were an odd number of 1's in the error code, there was a single bit error in the data word. This last case is the most probable type of error, and is the case in which early detection and the early triggering of an error recovery procedure is most beneficial, since an error recovery procedure can be initiated before the entire error code is generated to locate the error in the data word.

Consider, for example, a data word containing the number 212, or 11010100 in binary format. This data word, passed through the circuit illustrated in FIG. 1, produces a syndrome of 110101. Bit 0 of $S_C$ has as inputs bits 5, 4, 1, and 0 of the data word, which are 0, 1, 0, and 0, respectively. This odd number of 1's, or odd parity, results in a 1 in $S_C$ bit 0. Bit 1 of $S_C$ has as inputs bits 6, 5, 2, and 1 of the data word, which are 1, 0, 1, and 0, respectively. This even number of 1's, or even parity, results in a 0 in $S_C$ bit 1, and the remainder of the syndrome bits are generated similarly.

If, after the protected transaction, the data word contains a single erroneous bit, the check syndrome will not match the reference syndrome. For example, an erroneous data word with the number 148, or 10010100 in binary format, contains a single bit error in bit 6 of the data word. This data word produces a syndrome of 010011. The resulting error code, the reference syndrome XOR'd with the check syndrome (110101 XOR 010011), is 100110. Note that the error code has an odd number of 1's, and has more than one 1. From table 2 above we can determine that the data word contains a single bit error. From table 1 above, we can determine that the error lies in bit 6 of the data word. (Note that the row for bit 6 is X00XX0, matching the error code of 100110.) However, if we can generate a partial error code for the $S_C$ portion of the check syndrome before completing the entire error code, an error recovery procedure can be initiated early.

In this case, the $S_C$ portions of the reference and check syndromes are 0101 and 0011, respectively, so the resulting partial error code is 0110. Any non-zero value in this partial error code is used to trigger error recovery procedures early, before the remainder of the error code can be generated and interpreted.

Early error detection using an ECC enables faster recovery for correctable errors in the data word. Because this is the most likely type of error to occur when handling data, early error detection can provide substantial benefits when considered cumulatively over a large amount of data.

Some, but not all, non-correctable errors will be detected by the method and apparatus for early error detection when applied to partial ECC, initiating error recovery procedure early. The error recovery procedure can be terminated or modified as desired as soon as the entire error code is generated, indicating that the error is not correctable. Note, however, that if the error recovery procedure was to re-obtain the data, the early initiation of the error recovery procedure is beneficial even for non-correctable errors.

However, as mentioned above, not all non-correctable errors will be detected early with partial ECC when the $S_C$ XOR trees contain repeating patterns. For example, if the retrieved data word having two bit errors contains the number 144, or 10010000 in binary format, the resulting check syndrome is 000101. The error code generated from the reference syndrome above and this check syndrome is 110000. Note that the error code has an even number of 1's, and has more than one 1. From table 2 above we can determine that the data word contains two bits of error from anywhere. In this partial ECC system, two bits of error are not correctable, because the location of the two bits cannot be determined in the data word and/or reference syndrome. Furthermore, this two bit error would not trigger early error detection because the partial error code based on the $S_C$ portions of the reference and check syndromes is 0000, and it takes a non-zero value in the partial error code to indicate an error early. Other non-correctable two bit data errors however, where the error does not occur in the same relative position in the data groups or when $S_C$ does not contain repeating patterns in its XOR trees, would cause a non-zero partial error code and would therefore be detected early.

Figure 2:
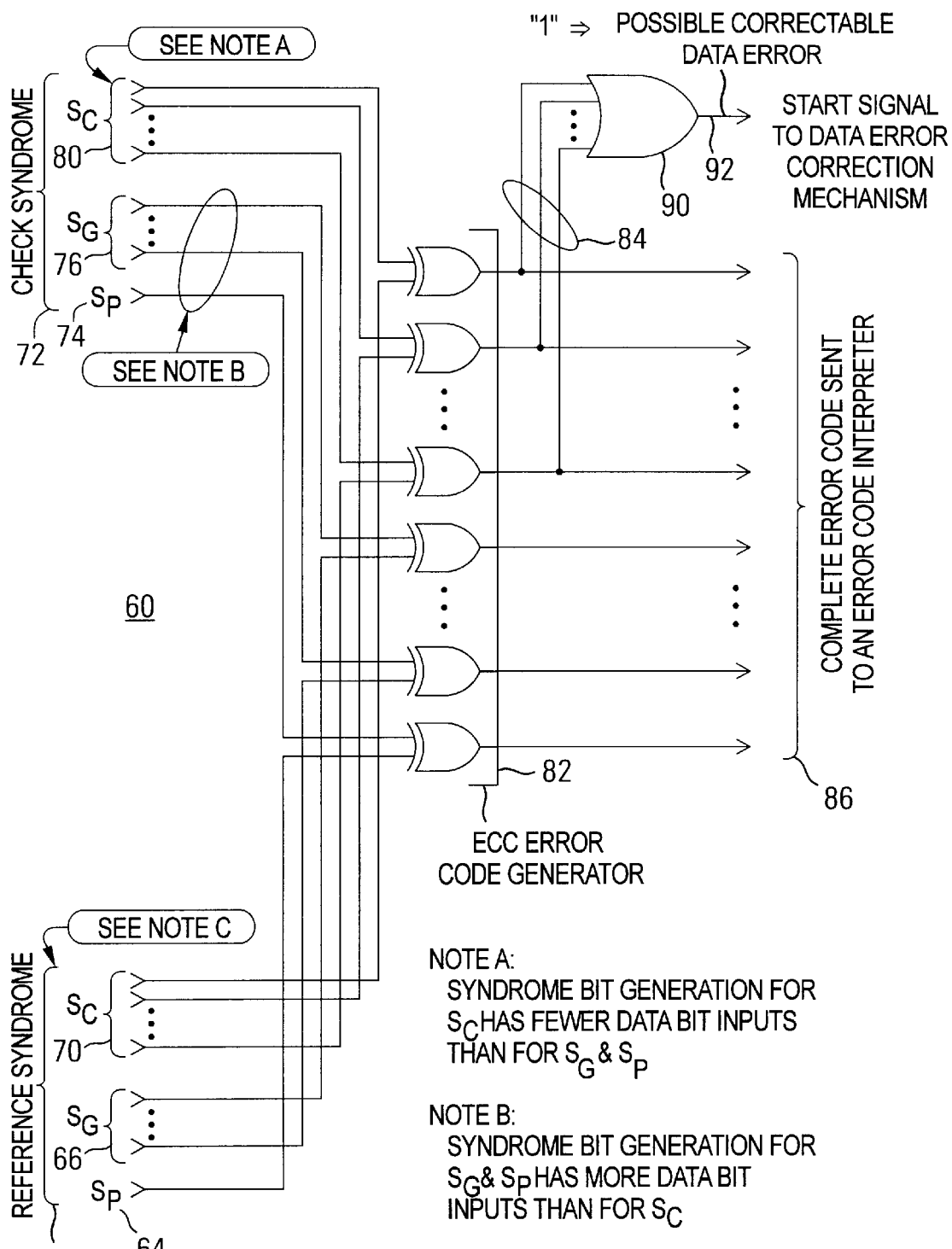
FIG. 2 is a diagram of an exemplary circuit for generating a partial and a complete error correction code from a reference and check syndrome, as well as generating a signal for early indication of possible correctable data errors.

Referring now to FIG. 2, an exemplary circuit 60 for early error detection in this partial ECC system is illustrated. The circuits for generating the reference and check syndromes from the data bits are not shown but may be as described above with respect to FIG. 1. The reference syndrome 62, consisting of $S_P$, $S_G$, and $S_C$ portions 64, 66, and 70, respectively, is combined with the check syndrome 72, consisting of $S_P$, $S_G$, and $S_C$ portions 74, 76, and 80, respectively, in an error code generator 82. The error code generator 82 may consist of any device for performing a bitwise XOR function to detect odd parity in the combination of corresponding reference and check syndrome bits, such as a series of XOR gates, one for each bit of the reference and check syndromes 62 and 72.

The $S_C$ portion 84 of the error code 86 is used as the input to an OR function 90 to detect a non-zero value. If the $S_C$ portion 84 of the error code 86 contains a non-zero value, a signal 92 from the OR function 90 indicates the possible presence of a correctable error, triggering an error recovery procedure.

For the most efficient and early detection of errors, the $S_C$ portions 70 and 80 of the syndromes 62 and 72 have fewer data bit inputs for each syndrome bit than the $S_P$ and $S_G$ portions 64, 74, 66 and 76. Thus, the $S_C$ portion 84 of the error code 86 would be available before the complete error code 86, speeding the availability of the signal 92 indicating a possible correctable error.

However, even if the same number of data bit inputs are used for syndrome bits in every portion of the syndromes, the signal 92 from the OR function 90 can be available before the entire error code 86 has been generated and interpreted, because of the fewer number of inputs and gate delays in the simple OR function 90. In general, partitioning the data into at least four groups is a good way of reducing the number of inputs into the OR function 90, simplifying wiring and speeding production of the output signal 92.

Also, note that only the $S_C$ portion 70 of the reference syndrome 62 need be available, along with the entire data word, to generate the $S_C$ portion 80 of the check syndrome 72 for early error detection. Thus, when data retrieval is performed in stages, if the data word and the $S_C$ portion 70 of the reference syndrome 62 is received before the $S_P$ and $S_G$ portions 64 and 66, this also facilitates early error detection.

Figure 3:
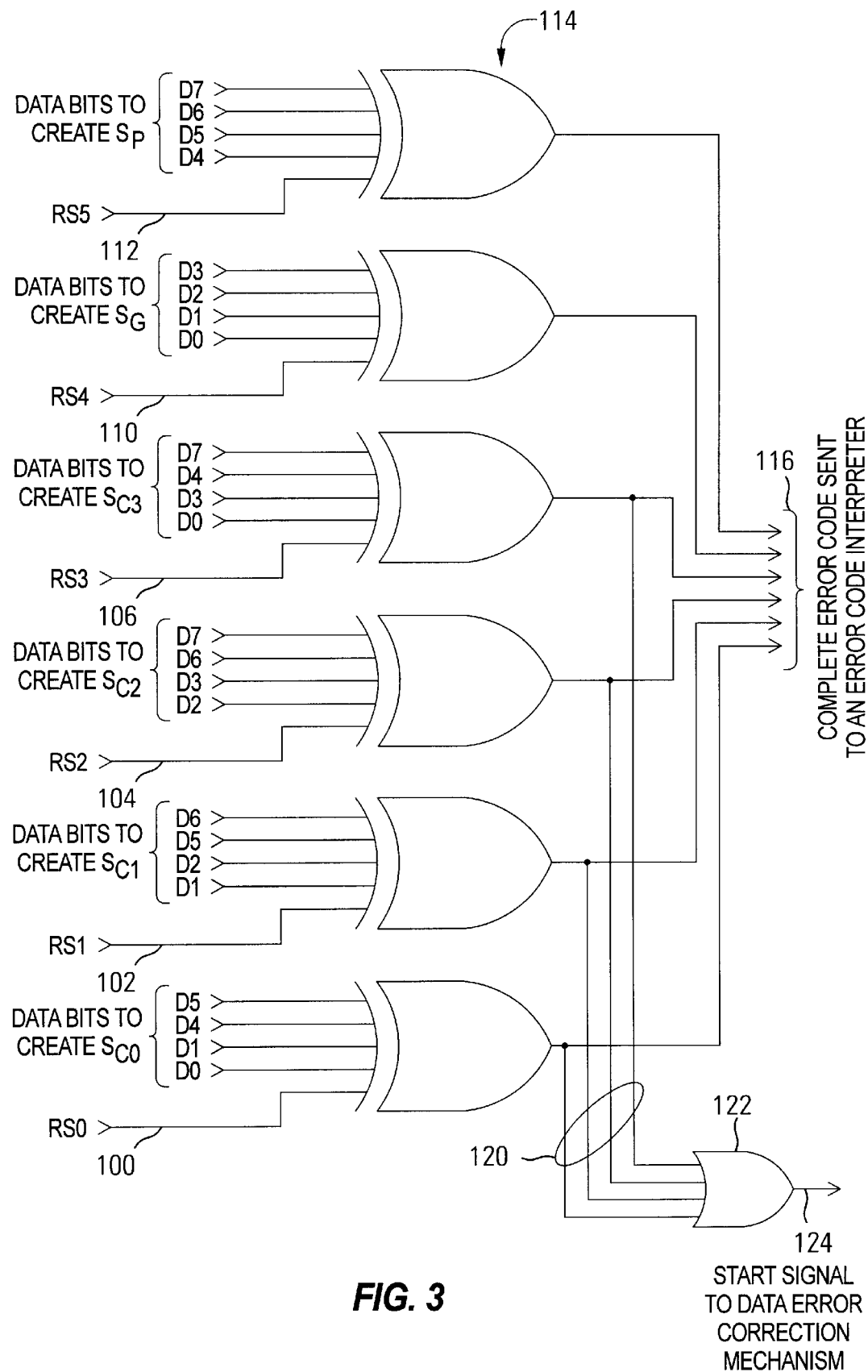
FIG. 3 is a diagram of an exemplary circuit for generating a partial and a complete error correction code from a reference syndrome and data bits from the source data word without generating a separate check syndrome, as well as generating a signal for early indication of possible correctable data errors.

In another embodiment (FIG. 3) of the exemplary partial ECC system, no independent check syndrome is generated. Rather, the reference syndrome bits 100, 102, 104, 106, 110, and 112 are included as inputs to the XOR trees 114 which would have been used to generate the check syndrome. Thus, the output from the XOR trees 114 is the complete error code 116, not a check syndrome. Again, the circuits illustrated in FIGS. 1 and 3 are conceptual, and may be implemented in any number of manners as desired and as constrained by the overall electronic system.

In this embodiment, the outputs 120 from the XOR trees 114 forming the partial error code are used as the inputs to an OR function 122 to produce the early correctable error signal 124.

Note that although the method and apparatus for early detection of errors is applicable to the partial ECC system described above, the entire $S_C$ portion of the check syndrome should be generated to determine the possible presence of a correctable data error, unless partial reference syndrome $S_C$ stages are stored with the data. That is, each group or partition in the data word should be processed and combined to form a complete and final $S_C$ portion before examining it for a non-zero value. For example, referring to table 1 above, $S_C$ stages should be generated for both groups 0 and 1, then XOR'd to generate the final $S_C$.

As mentioned above, errors can be detected earlier when the number of data bit inputs to the XOR trees can be shifted from one portion of the syndrome to another, speeding generation of the first syndrome portion. This technique becomes more practicable with larger data words, as illustrated in the following table, which compares the number of data bit inputs needed in each XOR tree for a full ECC system with partial ECC systems of various configurations:

TABLE 3

| Data Bits | Full Ecc | Group Size | $S_C$ Partial Ecc | $S_P$ & $S_G$ Partial Ecc |
|---|---|---|---|---|
| 32 | 2 × 13 | 4 Groups of 8 | 2 × 16 | 3 × 16 |
|  | 5 × 14 |  | 2 × 20 |  |
|  |  | 2 Groups of 16 | 2 × 14 | 2 × 16 |
|  |  |  | 3 × 16 |  |
| 64 | 8 × 26 | 8 Groups of 8 | 2 × 32 | 4 × 32 |
|  |  |  | 2 × 40 |  |
|  |  | 4 Groups of 16 | 2 × 28 | 3 × 32 |
|  |  |  | 3 × 32 |  |
|  |  | 2 Groups of 32 | 3 × 26 | 2 × 32 |
|  |  |  | 3 × 28 |  |
| 128 | 5 × 52 | 8 Groups of 16 | 2 × 56 | 4 × 64 |
|  | 4 × 53 |  | 3 × 64 |  |
|  |  | 4 Groups of 32 | 3 × 52 | 3 × 64 |
|  |  |  | 3 × 56 |  |
|  |  | 2 Groups of 64 | 3 × 50 | 2 × 64 |
|  |  |  | 4 × 52 |  |
| 256 | 10 × 104 | 16 Groups of 16 | 2 × 112 | 5 × 128 |
|  |  |  | 3 × 128 |  |
|  |  | 8 Groups of 32 | 3 × 104 | 4 × 128 |
|  |  |  | 3 × 112 |  |
|  |  | 4 Groups of 64 | 3 × 100 | 3 × 128 |
|  |  |  | 4 × 104 |  |
|  |  | 2 Groups of 128 | 8 × 100 | 2 × 128 |
| 512 | 3 × 202 | 16 Groups of 32 | 3 × 208 | 5 × 256 |
|  | 8 × 203 |  | 3 × 224 |  |
|  |  | 8 Groups of 64 | 3 × 200 | 4 × 256 |
|  |  |  | 4 × 208 |  |
|  |  | 4 Groups of 128 | 8 × 200 | 3 × 256 |
|  |  | 2 Groups of 256 | 4 × 194 | 2 × 256 |
|  |  |  | 5 × 196 |  |
| 1024 | 12 × 392 | 32 Groups of 32 | 3 × 416 | 6 × 512 |
|  |  |  | 3 × 448 |  |
|  |  | 16 Groups of 64 | 3 × 400 | 5 × 512 |
|  |  |  | 4 × 416 |  |
|  |  | 8 Groups of 128 | 8 × 400 | 4 × 512 |
|  |  | 4 Groups of 256 | 4 × 388 | 3 × 512 |
|  |  |  | 5 × 392 |  |
|  |  | 2 Groups of 512 | 5 × 394 | 2 × 512 |
|  |  |  | 5 × 396 |  |

The first column contains the number of bits in the data word for that section of the table. The second column indicates the number of data bit inputs for each syndrome bit in a full ECC system. For example, for a data word of 1024 bits, a full ECC syndrome has 12 bits, each having 392 data bit inputs. The third column indicates how the data word can be partitioned into groups in a partial ECC system For example, a data word of 1024 bits can be partitioned into 32 groups of 32 data bits each, or 2 groups of 512 bits each, etc. The fourth column indicates the number of data bit inputs for each $S_C$ syndrome bit in a partial ECC system with a given number of data groups. For example, when the data word of 1024 bits is partitioned into 2 groups of 512 bits each, the $S_C$ portion of the syndrome has 5 bits generated with 394 data bit inputs and 5 bits generated with 396 data bit inputs. Finally, the fifth column indicates the number of data bit inputs for the $S_P$ and $S_G$ syndrome bits. For example, when the data word of 1024 bits is partitioned into 2 groups of 512 bits each, the $S_P$ and $S_G$ portions of the syndrome consist of 2 bits generated with 512 data bit inputs each.

As indicated in the table above, several arrangements of the partial ECC system have fewer data bit inputs for their $S_C$ syndrome bits than the corresponding full ECC systems. For example, with a data word of 256 bits, the full ECC system requires 104 data bit inputs for each of the 10 syndrome bits. When the data word is partitioned into two groups of 128 bits each in a partial ECC system, the eight $S_C$ syndrome bits require only 100 data bit inputs. A data word of 512 bits in the full ECC system has 3 syndrome bits with 202 inputs and 8 syndrome bits with 203 inputs, while the same data word broken into two groups of 256 bits in a partial ECC system has 4 $S_C$ syndrome bits with 194 inputs and 5 with 196 inputs, clearly fewer than in the full ECC system. This savings in inputs simplifies the wiring and can reduce the gate delays in forming the $S_C$ syndrome bits, leading to earlier detection of correctable errors. This savings adds to the savings already discussed resulting from the small and fast OR gates (e.g., 90) used to detect errors from a partial error code.

Figure 4:
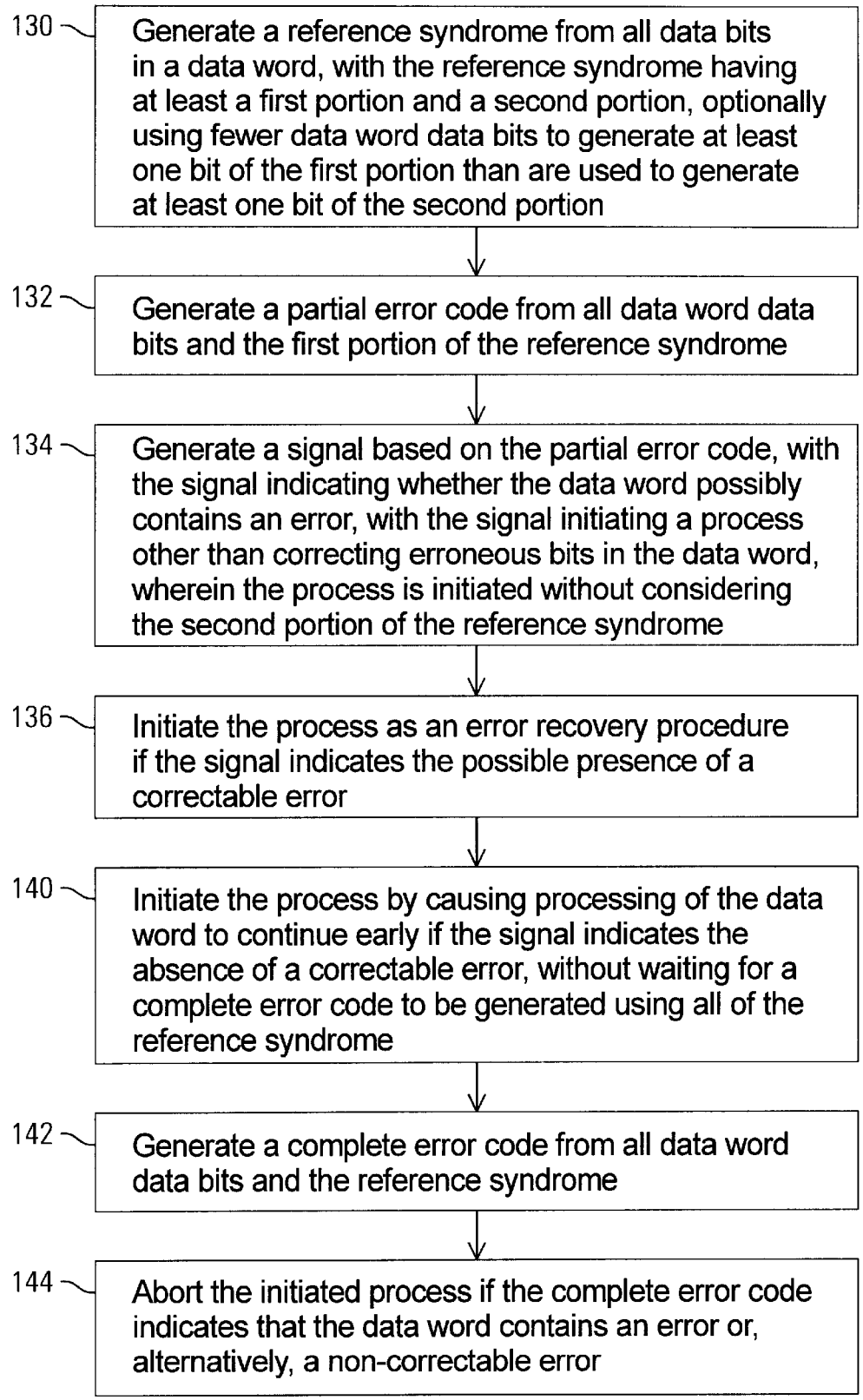
FIG. 4 is a flowchart illustrating an exemplary operation for early detection of errors.

Referring now to FIG. 4, an exemplary embodiment of the method for early detection of errors may be summarized as follows. A reference syndrome is generated 130 from all data bits in a data word, with the reference syndrome having at least a first portion and a second portion, optionally using fewer data word data bits to generate at least one bit of the first portion than are used to generate at least one bit of the second portion. A partial error code is generated 132 from all data word data bits and the first portion of the reference syndrome. A signal is generated 134 based on the partial error code, with the signal indicating whether the data word possibly contains an error, with the signal initiating a process other than correcting erroneous bits in the data word, wherein the process is initiated without considering the second portion of the reference syndrome. The process is initiated 136 as an error recovery procedure if the signal indicates the possible presence of a correctable error. The process is initiated 140 by causing processing of the data word to continue early if the signal indicates the absence of a correctable error, without waiting for a complete error code to be generated using all of the reference syndrome. A complete error code is generated 142 from all data word data bits and the reference syndrome. The initiated process may be aborted 144 if the complete error code indicates that the data word contains an error or, alternatively, a non-correctable error.

Again, the method and apparatus for early error detection using an ECC described herein is applicable to any type of ECC system in which the syndromes can be divided into portions, where one of the portions can indicate the presence of correctable errors before the entire error code can be generated and interpreted. It is particularly beneficial when the data bit contributions can be minimized in the portion used for early error detection, although it speeds recovery from correctable errors even when the data bit contributions are not minimized.

While illustrative and presently preferred embodiments have been described in detail herein, it is to be understood that the inventive concepts may be otherwise variously embodied and employed, and that the appended claims are intended to be construed to include such variations, except as limited by the prior art.

What is claimed is:

1. A method of detecting data errors, the method comprising:

generating a reference syndrome from data bits in a data word, said data bits comprising all data bits in said data word, said reference syndrome comprising at least a first portion and a second portion;

generating a partial error code from said data bits and said first portion of said reference syndrome;

generating a signal based on said partial error code, said signal indicating whether said data word possibly contains an error, said signal initiating a process other than correcting erroneous bits in said data word, wherein said process is initiated without considering said second portion of said reference syndrome.

2. The method of claim 1, said process comprising causing processing of said data word to continue early, without waiting for a complete error code to be generated using all of said reference syndrome, wherein said process is initiated if said signal does not indicates the possible presence of a correctable error.

3. The method of claim 1, wherein said signal is generated from said partial error code using an OR function to determine whether said partial error code contains any true values.

4. The method of claim 1, wherein a fewer number of said data bits is used to generate at least one bit of said reference syndrome first portion than at least one bit of said reference syndrome second portion.

5. The method of claim 1, wherein each of said data bits in said data word contributes to at least one bit of said reference syndrome first portion.

6. The method of claim 1, wherein said partial error code is generated with a bitwise XOR function of groups of said data bits and said reference syndrome first portion.

7. The method of claim 1, wherein said reference syndrome comprises a reference syndrome for a Hamming partial error correction code.

8. The method of claim 1, further comprising generating a check syndrome from said data bits in said data word, said check syndrome comprising at least a first portion and a second portion, wherein said partial error code is generated from said reference syndrome first portion and said check syndrome first portion.

9. The method of claim 8, wherein said partial error code is generated with a bitwise XOR function of said reference syndrome first portion and said check syndrome first portion.

10. The method of claim 1, wherein each bit of said reference syndrome is true when it is generated from data bits having an odd number of true values.

11. The method of claim 10, wherein each bit of said reference syndrome is generated with an XOR tree having as inputs a plurality of said data bits.

12. The method of claim 1, said process comprising an error recovery procedure, wherein said error recovery procedure is initiated if said signal indicates the possible presence of a correctable error.

13. The method of claim 12, further comprising:

generating a complete error code from said data bits and said reference syndrome; and aborting said error recovery procedure if said complete error code indicates that said data word contains a non-correctable error.

14. The method of claim 12, further comprising:

generating a complete error code from said data bits and said reference syndrome; and aborting said error recovery procedure if said complete error code indicates that said reference syndrome contains an error.

15. The method of claim 1, further comprising generating a complete error code from said data bits and said reference syndrome.

16. The method of claim 15, wherein generating said complete error code from said data bits and said reference syndrome comprises generating said complete error code from said reference syndrome and a check syndrome, wherein said check syndrome is generated from said data bits.

17. The method of claim 15, wherein a first number of said data bits is used to generate at least one bit of said complete error code, and a second number of said data bits is used to generate at least one bit of said partial error code, and wherein said first number is greater than said second number.

18. An error correction code apparatus for early detection of errors in a data word, comprising:
- a plurality of first logic gates having a plurality of data inputs for receiving each data bit of said data word and for receiving a portion of the bits of a reference syndrome, and having a plurality of outputs to carry a partial error code for said data word; and
- at least one second logic gate having a plurality of inputs connected to said plurality of outputs of said plurality of first logic gates, said at least one second logic gate having an output, wherein a true value at said output indicates the possible presence of an error in said data word and initiates a process other than correcting erroneous bits in said data word, and wherein neither said plurality of first logic gates nor said at least one second logic gate have as inputs any bits of said reference syndrome other than said portion.

19. The error correction code apparatus of claim 18, wherein said plurality of first logic gates comprise XOR gates.

20. The error correction code apparatus of claim 18, wherein said at least one second logic gate comprises at least one OR gate.

21. The error correction code apparatus of claim 18, further comprising a plurality of third logic gates having a plurality of data inputs for receiving each data bit of said data word and for receiving a remainder of said bits of said reference syndrome, and having a plurality of outputs to carry a second partial error code for said data word, so that said outputs of said pluralities of first and third logic gates, taken together, carry a complete error code for said data word.

22. The error correction code apparatus of claim 21, wherein said plurality of third logic gates comprise XOR gates.

23. An error correction code apparatus for early detection of errors in a data word, comprising:
- a reference syndrome generator for generating a reference syndrome representing said data word;
- means for detecting whether a copy of said data word contains an error and for initiating a process other than correcting erroneous bits in said data word by examining only a portion of said reference syndrome and all the bits of said copy of said data word.

* * * * *